United States Patent
Wang et al.

(10) Patent No.: US 9,778,527 B2
(45) Date of Patent: Oct. 3, 2017

(54) ARRAY SUBSTRATE AND METHOD FOR DETECTING THE SAME

(71) Applicant: SHENZHEN CHINA STAR OPTOELECTRONICS TECHNOLOGY CO., LTD., Shenzhen (CN)

(72) Inventors: Zui Wang, Shenzhen (CN); Shih Hsun Lo, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 5 days.

(21) Appl. No.: 14/416,302

(22) PCT Filed: Dec. 3, 2014

(86) PCT No.: PCT/CN2014/092888
§ 371 (c)(1),
(2) Date: Jan. 22, 2015

(87) PCT Pub. No.: WO2016/074292
PCT Pub. Date: May 19, 2016

(65) Prior Publication Data
US 2016/0342050 A1    Nov. 24, 2016

(30) Foreign Application Priority Data
Nov. 14, 2014    (CN) .......................... 2014 1 0650209

(51) Int. Cl.
*G02F 1/1362* (2006.01)
*G02F 1/13* (2006.01)
(Continued)

(52) U.S. Cl.
CPC ....... *G02F 1/136259* (2013.01); *G01R 31/02* (2013.01); *G02F 1/13* (2013.01);
(Continued)

(58) Field of Classification Search
CPC ..... G01R 31/021; G01R 31/025; G09G 3/006
(Continued)

(56) References Cited

U.S. PATENT DOCUMENTS

2010/0110324 A1    5/2010    Chang
2012/0319974 A1*   12/2012   Kim ..................... G06F 3/044
                                                    345/173
(Continued)

FOREIGN PATENT DOCUMENTS

| CN | 102455960 A | 5/2012 |
| CN | 103309065 A | 9/2013 |
| CN | 104077989 A | 10/2014 |

OTHER PUBLICATIONS

International Search Report and Written Opinion of the International Searching Authority (Forms PCT/ISA/237, PCT/ISA/210, PCT/ISA/220) issued on Jul. 1, 2015, by the State Intellectual Property Office of the People's Republic of China in corresponding International Application No. PCT/CN2014/092888. (11 pages).

*Primary Examiner* — Jermele M Hollington
*Assistant Examiner* — Douglas X Rodriguez
(74) *Attorney, Agent, or Firm* — Buchanan Ingersoll & Rooney PC (57) ABSTRACT

An array substrate and a method for detecting the array substrate are disclosed. The array substrate comprises a display area and a detecting area. In a first detecting mode, a first to a sixth detecting circuits are divided into three groups, and a first detecting signal is successively provided to these three groups of detecting circuits, so that a circuit defect possibly existing in a charge line and a share line that (Continued)

are located in each row of subarea can be detected. In a second detecting mode, the first to the sixth detecting circuits are divided into two groups, and a second detecting signal is provided to the two groups of detecting circuits successively, so that a circuit defect possible existing in the charge line and the share line that are located in adjacent rows of subareas can be detected.

14 Claims, 4 Drawing Sheets (51) Int. Cl.
  *G01R 31/02* (2006.01)
  *G09G 3/00* (2006.01)
(52) U.S. Cl.
  CPC . *G09G 3/006* (2013.01); *G02F 2001/136254* (2013.01); *G02F 2001/136263* (2013.01)
(58) Field of Classification Search
  USPC .......................................................... 324/527
  See application file for complete search history.

(56) References Cited

U.S. PATENT DOCUMENTS

2014/0361805 A1    12/2014  Xu
2016/0225798 A1*    8/2016  Wang .................... G09G 3/006

* cited by examiner

ARRAY SUBSTRATE AND METHOD FOR DETECTING THE SAME

CROSS-REFERENCE TO RELATED APPLICATIONS

The present application claims benefit of Chinese patent application CN 201410650209.2, entitled "Array substrate and method for detecting the same" and filed on Nov. 14, 2014, the entirety of which is incorporated herein by reference.

FIELD OF THE INVENTION

The present disclosure relates to the field of liquid crystal display, and in particular, to an array substrate and a method for detecting the array substrate.

BACKGROUND OF THE INVENTION

When the circuit of a traditional display panel is designed, a periphery wire termed as a shorting bar is usually arranged circumferentially around the panel outside of a display area, with gate lines guided to the periphery wire according to whether they are odd-numbered or even-numbered, respectively. That is, odd-numbered gate lines on the panel are all connected to one another outside the display area, and the even-numbered gate lines on the panel are all connected to one another outside the display area also. With such a design, different electric signals can be applied to the odd-numbered and even-numbered gate lines respectively to detect whether a short circuit or an open circuit exists in the display panel during a detection step in the TFT manufacturing procedure. Moreover, different data signals can be additionally used to detect other types of undesirable conditions. The shorting bar can be disconnected or removed after the detection, and will not affect normal display of a final product.

Figure 1:
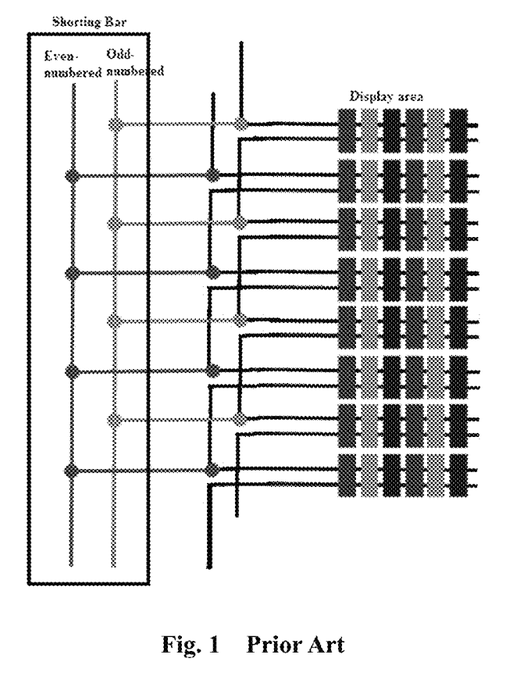
FIG. 1 schematically shows the structure of a circuit of a charge sharing array substrate having a shorting bar in the prior art.

In order to eliminate the phenomenon of color shift occurring in a vertical alignment liquid crystal display panel viewed at a large viewing angle, a pixel can be designed via a charge sharing manner. FIG. 1 schematically shows the structure of a circuit of a charge sharing array substrate having the shorting bar in the prior art. As indicated in FIG. 1, a signal applied to a charge gate line located in an $(N+2)^{th}$ row is used to control activation and deactivation of a share gate line located in an $N^{th}$ row. Where a short circuit occurs between a charge gate line and the share gate line that are located in the $N^{th}$ row, because the share gate line located in the $N^{th}$ row and the charge gate line located in the subsequent $(N+2)^{th}$ row are connected to each other, and the charge gate lines that are located in the $N^{th}$ row and the $(N+2)^{th}$ row are both odd-numbered or both even-numbered in sequence, the above detection method of guiding the odd-numbered and even-numbered rows respectively to the shorting bar cannot be used to detect the short circuit defect during the TFT procedure. This can lead to use of cell lighting or even final product testing, which would cause unsatisfactory horizontal gate lines and reduce yield rates.

Figure 2:
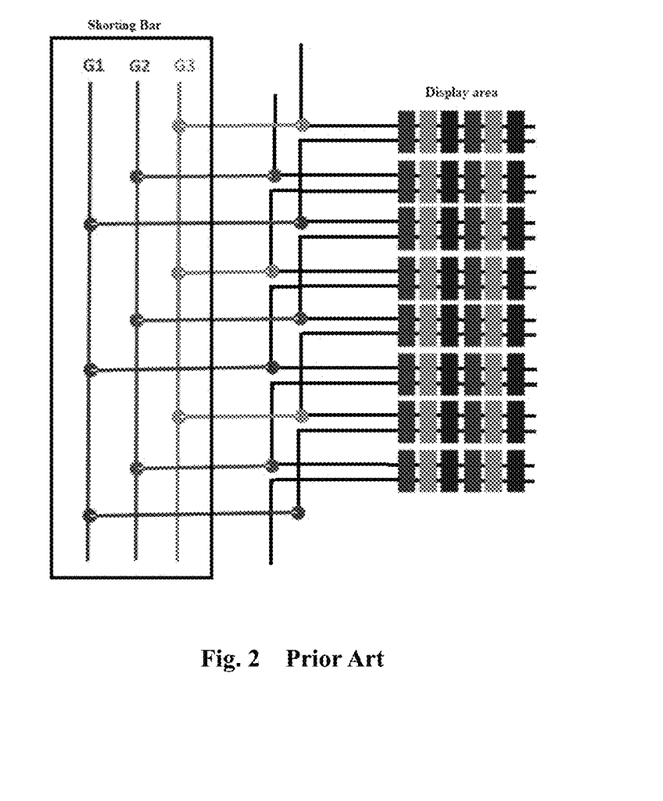
FIG. 2 schematically shows the structure of a circuit of another charge sharing array substrate having the shorting bar in the prior art.

As shown in FIG. 2, an array substrate provided with three detecting circuits in a shorting bar area is further provided in the prior art. Detecting circuits G1, G2, and G3 are respectively connected to three successive rows of charge gate lines that are located in the display area, and detecting signals are successively provided to the three detecting circuits. This solution can be used to detect a short circuit defect possibly existing between a charge gate line and a share gate line that are located in one and a same row, whereby a more complicated detection mode has to be performed through a longer time period. Particularly, in mass production, because various procedures have become gradually stable, such a circuit defect will have a rather low probability of occurring. Consequently, if this solution is still to be used, the efficiency of detection would be low and the production capacity would be affected.

SUMMARY OF THE INVENTION

The present disclosure aims to solve the technical problem of low detection efficiency during a TFT procedure, caused by a single detection mode and therefore inability of switch between different detection modes according to the conditions of yield rates in different stages.

In order to solve the above technical problem, an embodiment of the present disclosure provides an array substrate, comprising:

a display area, which includes a plurality of rows of subareas, each row of subarea being provided with a charge line and a share line, wherein the share line located in an $N^{th}$ row of subarea is connected to the charge line located in an $(N+J)^{th}$ row of subarea, N being a positive number while J being a positive even number, and a detecting area, which includes six detecting circuits from a first detecting circuit to a sixth detecting circuit, connected to the charge lines located in six successive rows of subareas in the display area in one-to-one correspondence, wherein in a first detecting mode, the first to the sixth detecting circuits are divided into three groups, and a first detecting signal is provided to the three groups of detecting circuits successively, to detect a circuit defect possibly existing in the charge line and the share line that are located in each row of subarea, and wherein in a second detecting mode, the first to the sixth detecting circuits are divided into two groups, and a second detecting signal is provided to the two groups of detecting circuits successively, to detect a circuit defect possibly existing in the charge lines and the share lines that are located in adjacent rows of subareas.

In one embodiment, in the first detecting mode, the three groups of detecting circuits include a group consisting of the first and the fourth detecting circuits, a group consisting of the second and the fifth detecting circuits, and a group consisting of the third and the sixth detecting circuits.

In one embodiment, in the second detecting mode, the two groups of detecting circuits include a group consisting of the first, the third, and the fifth detecting circuits, and a group consisting of the second, the fourth, and the sixth detecting circuits.

In one embodiment, when the first detecting signal is in effect, a difference value between and among row numbers of subareas that receive the first detecting signal via corresponding charge lines is a multiple of 3.

In one embodiment, J is 2 or 4.

The embodiments of the present disclosure further provide a method for detecting an array substrate, wherein the array substrate comprises:

a display area, which includes a plurality of rows of subareas, each row of subarea being provided with a charge line and a share line, wherein the share line located in an $N^{th}$ row of subarea is connected to the charge line located in an $(N+J)^{th}$ row of subarea, N being a positive number while J being a positive even number, and a detecting area, which includes six detecting circuits from a first detecting circuit to a sixth detecting circuit, connected to the charge lines located in six successive rows of subareas in the display area in one-to-one correspondence, and wherein the method comprises the following steps:

dividing, in a first detecting mode, the first to the sixth detecting circuits into three groups, and providing a first detecting signal to the three groups of detecting circuits successively, to detect a circuit defect possibly existing in the charge line and the share line that are located in each row of subarea, and dividing, in a second detecting mode, the first to the sixth detecting circuits into two groups, and providing a second detecting signal to the two groups of detecting circuits successively, to detect a circuit defect possibly existing in the charge lines and the share lines that are located in adjacent rows of subareas.

In one embodiment, in the first detecting mode, the three groups of detecting circuits include a group consisting of the first and the fourth detecting circuits, a group consisting of the second and the fifth detecting circuits, and a group consisting of the third and the sixth detecting circuits.

In one embodiment, in the second detecting mode, the two groups of detecting circuits include a group consisting of the first, the third, and the fifth detecting circuits, and a group consisting of the second, the fourth, and the sixth detecting circuits.

In one embodiment, when the first detecting signal is in effect, a difference value between and among row numbers of subareas that receive the first detecting signal via corresponding charge lines is a multiple of 3.

In one embodiment, J is 2 or 4.

The present disclosure has brought about the following beneficial effects. Six detecting circuits are provided in the detecting area, and two detecting modes are used. In the two detecting modes, different detecting signals are applied to the six detecting circuits, whereby different detecting effects can be obtained. Therefore, the two detecting modes can be switched therebetween according to the production conditions in the TFT procedure, thereby improving the rate and accuracy of detection.

Other features and advantages of the present disclosure will be further explained in the following description, and partly become self-evident therefrom, or be understood through implementing the present disclosure. The objectives and advantages of the present disclosure will be achieved through the structure specifically pointed out in the description, claims, and the accompanying drawings.

BRIEF DESCRIPTION OF THE DRAWINGS

The drawings are provided for further understanding of the present disclosure and the prior art, and constitute one part of the description. They are not to limit the present disclosure in any manner. In the drawings.

DETAILED DESCRIPTION OF THE EMBODIMENTS

In order to make the purpose, technical solutions, and advantages of the present disclosure clearer, the present disclosure will be explained in detail in the following in conjunction with the accompany drawings. As long as there is no conflict, the embodiments of the present disclosure and the features contained therein can be combined in any manner. The technical solutions formed thereby all fall within the scope of the present disclosure.

Spatial references in the present disclosure, such as "upper," "lower," "left," "right," "front," "back," and the like indicate respective directions relative to the accompanying drawings. Hence, they are for illustrative purposes only and are not intended to be limiting of the claimed disclosure.

Embodiment One

Figure 3:
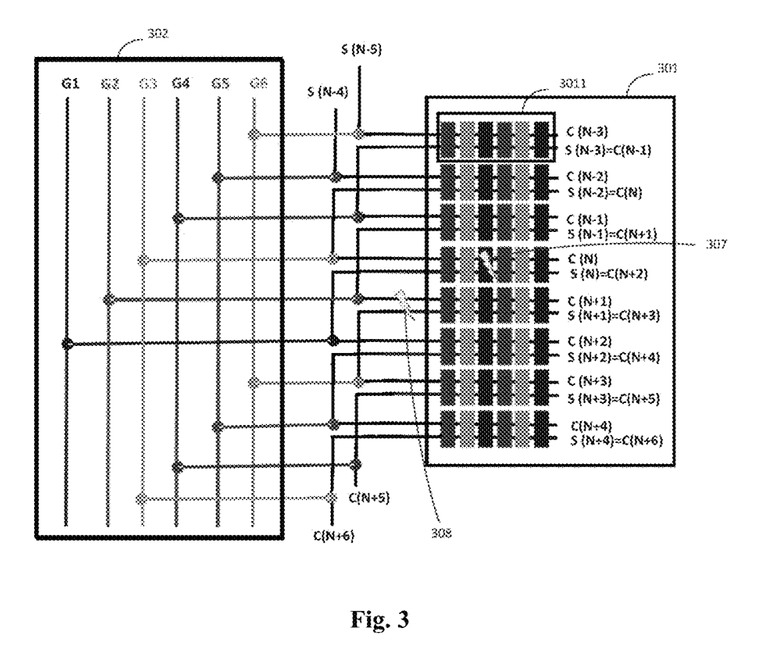
FIG. 3 schematically shows the structure of a circuit of an array substrate according to an embodiment of the present disclosure.

FIG. 3 schematically shows the structure of a circuit of an array substrate according to this embodiment. The array substrate comprises a display area 301, and a detecting area 302 which is arranged at one side of the display area 301.

The display area 301 comprises a plurality of rows of subareas 3011. These subareas are arranged in an array, so as to form a sub pixel array subsequently during a manufacturing procedure. Each row of subarea is provided with a charge line and a share line. The share line located in each row of subarea is connected to the charge line located in another row of subarea, wherein the row number of the row where said charge line is located is two more than the row number of the row where said share line is located. That is, the charge line located in each row of subarea provides a signal to the share line located in another row of subarea, wherein said share line is located above said charge line and spaced from said charge line by one row of subarea.

For instance, as indicated in FIG. 3, the subarea located in the $N^{th}$ row is provided with a charge line C(N) and a share line S(N), and the subarea located in an $(N-2)^{th}$ row is provided with a charge line C(N-2) and a share line S(N-2). The share line S(N-2) located in the $(N-2)^{th}$ row is connected to the charge line C(N) located in the $N^{th}$ row, so that a scan signal of the charge line C(N) can be used to control activation or deactivation of the share line S(N-2).

The detecting area 302 is provided with six detecting circuits, from a first detecting circuit G1 to a sixth detecting circuit G6, which are used for providing detecting signals to the display area 301, so as to detect a defect possibly existing in the charge lines and share lines that are located in the display area 301. The detecting circuits G1-G6 are respectively connected to the charge lines located in six successive rows of subareas in the display area in one to one correspondence. In the embodiment as shown in FIG. 3, the first detecting circuit G1 is connected to a charge line C(N+2) located in an $(N+2)^{th}$ row of subarea, and the second detecting circuit G2 is connected to a charge line C(N+1) located in an $(N+1)^{th}$ row of subarea. Similarly, the third to the sixth detecting circuits G3-G6 are respectively connected to charge lines that are located in the $N^{th}$, $(N-1)^{th}$, $(N-2)^{th}$, and $(N-3)^{th}$ rows of subareas.

A method for detecting the array substrate provided in the present embodiment will be explained in detail in the following.

During an early stage of mass production of the array substrate, the environment of manufacture procedures is subject to relatively poor cleanness. Particles, such as dust, would influence the procedures of photoetching and exposing. This would easily cause a short circuit defect between the charge line and the share line that are located within each row of subarea. Such a short circuit defect may occur within the subarea of the display area, and may occur in a line bridge area outside of the subarea also. For example, as FIG. 3 shows, a short circuit between the charge line C(N) and the share line S(N) occurs at a position 307 located in the $N^{th}$ row of subarea, or a short circuit between the charge line C(N+1) and the share line S(N+1) occurs at a position 308 located outside of the $(N+1)^{th}$ row of subarea.

In this case, a first detecting mode is used for detection. The first to sixth detecting circuits G1-G6 are divided into three groups, i.e., a first group including G1 and G4, a second group including G2 and G5, and a third group including G3 and G6. These three groups are successively provided with a first detecting signal.

The first detecting signal can be provided through three consecutive detecting time periods: T1, T2, and T3.

During the time period of T1, the detecting signal is provided to the detecting circuits G1 and G4. At this moment, no detecting signal exists in G2 and G5, or G3 and G6. Normally, the charge line C(N+2) located in the $(N+2)^{th}$ row of subarea, and the share line S(N) located in the $N^{th}$ row of subarea can receive the first detecting signal from the detecting circuit G1. Similarly, the charge line C(N−1) located in the $(N-1)^{th}$ row of subarea, and the share line S(N−3) located in the $(N-3)^{th}$ row of subarea can receive the first detecting signal from the detecting circuit G4. Moreover, the charge line C(N+5) located in the $(N+5)^{th}$ row of subarea, and the share line S(N+3) located in the $(N+3)^{th}$ row of subarea can receive the first detecting signal from the detecting circuit G4 also. That is, the row numbers of the subareas that can receive the first detecting signal via corresponding charge lines are N−1, N+2, and N+5, wherein a difference value between and among the row numbers can be 3 or 6.

If a short circuit defect exists at the position 307 of the array substrate, the charge line C(N) located in the $N^{th}$ row would also receive the first detecting signal, due to a short circuit connection between the charge line C(N) and the share line S(N) that are located in the $N^{th}$ row. This would further enable the detecting circuit G3 to receive the first detecting signal. As such, the detecting method according to this embodiment can be used to detect a shot circuit defect possibly existing between the charge line and the share line that are located in the $N^{th}$ row of subarea.

As can be readily understood, during the time period of T1, if the charge line C(N+2) located in the $(N+2)^{th}$ row, or the share line S(N) located in the $N^{th}$ row cannot receive the first detecting signal, it would be an indication that an open circuit exists in the charge line C(N+2) or in the share line S(N).

During the time period of T2, the detecting signal is provided to the detecting circuits G2 and G5. At this moment, no detecting signal exists in G1 and G4, or G3 and G6. Normally, the charge line C(N+1) located in the $(N+1)^{th}$ row of subarea, and the share line S(N−1) located in the $(N-1)^{th}$ row of subarea can receive the first detecting signal from the detecting circuit G2, while the charge line C(N−2) located in the $(N-2)^{th}$ row of subarea, and the share line S(N−4) located in the $(N-4)^{th}$ row of subarea can receive the first detecting signal from the detecting circuit G5. That is, the row numbers of the subareas that can receive the first detecting signal via corresponding charge lines are N+1 and N−2, wherein a difference value between the row numbers is 3.

If a short circuit defect exists at the position 308 of the array substrate, the charge line C(N+3) located at the $(N+3)^{th}$ row would also receive the first detecting signal, due to a short circuit connection between the charge line C(N+3) located in the $(N+3)^{th}$ row, and the share line S(N+1) located in the $(N+1)^{th}$ row. This would further enable the detecting circuit G6 to receive the first detecting signal. As such, the detecting method according to this embodiment can be used to detect a shot circuit defect possibly existing between the charge line and the share line that are located in the $(N+1)^{th}$ row of subarea.

As can be readily understood, during the time period of T2, if the charge line C(N+1) located in the $(N+1)^{th}$ row, or the share line S(N−1) located in the $(N-1)^{th}$ row cannot receive the first detecting signal, it would be an indication that an open circuit exists in the charge line C(N+1) or in the share line S(N−1).

Similarly, during the time period of T3, the detecting signal is provided to the detecting circuits G3 and G6. At this moment, no detecting signal exists in G1 and G4, or G2 and G5. In this case, a short circuit defect possibly existing in the charge line and share line that are located in the $(N-1)^{th}$ row of subarea can be detected.

Therefore, accurate detection can be completed in the first detecting mode, thereby improving the detection rate of circuit defects possibly exiting in the array substrate. Nevertheless, a relatively long time is necessary for detection in this mode, which is of low efficiency.

In mass production, because the manufacture procedure conditions have become increasingly stable, a short circuit defect will have a rather low probability of occurring between the charge line and the share line that are located within each row of subarea. Under such circumstances, if the first detecting mode is still to be used, a low detection rate would be caused. A second detecting mode is further provided in this embodiment for completion of rapid detection.

In the second detecting mode, the first to the sixth detecting circuits G1-G6 are divided into two groups, i.e., a first group consisting of G1, G3, and G5, and a second group consisting of G2, G4, and G6. A second detecting signal is provided to these two groups of detecting circuits successively. The second detecting signal can be provided through two consecutive detecting time periods: T1 and T2.

During the time period of T1, the second detecting signal is provided to the detecting circuits G1, G3, and G5. At this moment, no detecting signal exists in G2, G4, or G6. If a short circuit exists between the charge lines located in the $N^{th}$ and $(N-1)^{th}$ rows of subareas, the charge line C(N−1) would receive the second detecting signal from G3, and the detecting circuit G4 would then receive the second detecting signal. Thus, a short circuit defect possibly exiting between the charge lines located in adjacent rows of subareas can be detected.

During the time period of T2, the second detecting signal is provided to the detecting circuits G2, G4, and G6. At this moment, no detecting signal exists in G1, G3, or G5. Similarly, a short circuit defect possibly exiting between the charge lines and share lines located in adjacent rows of subareas can be detected.

Under this detecting mode, a high detection rate can be obtained, and production capacity can be improved as compared with that under the first detecting mode. In this detecting mode, odd-numbered and even-numbered gate lines are provided with different electric signals, to detect possible existence of a short circuit or an open circuit in the array substrate. Other types of unsatisfactory conditions can also be detected when different data signals are additionally used in connection with the electric signals.

This embodiment is directed to an N+2 type charge sharing array substrate, wherein six detecting circuits are provided in the detecting area, and two detecting modes can be adopted. In the two detecting modes, different detecting signals are applied to the six detecting circuits, whereby different detecting effects can be obtained. Therefore, the two detecting modes can be switched therebetween according to the production conditions, thereby improving the detecting rate.

Embodiment Two

Figure 4:
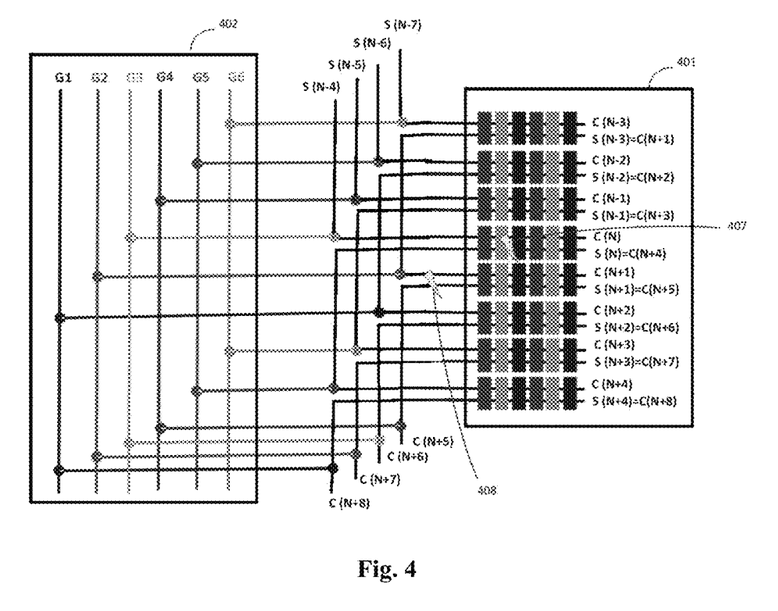
FIG. 4 schematically shows the structure of a circuit of an array substrate according to another embodiment of the present disclosure.

FIG. 4 schematically shows the structure of a circuit of an array substrate according to this embodiment. The array substrate comprises a display area 401, and a detecting area 402 which is arranged at one side of the display area 401. Six detecting circuits G1-G6 are respectively connected to six charge lines that are located in six successive rows of subareas in the display area in one-to-one correspondence.

Different from Embodiment One, in Embodiment Two, the share line in each row of subarea is connected to the charge line located in another row, wherein the row number of the row where said charge line is located is 4 more than the row number of the row where said share line is located. That is, the charge line located in each row of subarea provides a signal to the share line located in another row of subarea, wherein said share line is located above said charge line and spaced from said charge line by three rows of subareas. For example, as shown in FIG. 4, the share line S(N−3) located in the (N−3)$^{th}$ row is connected to the charge line C(N+1) located in the (N+1)$^{th}$ row, so that a scan signal of the charge line C(N+1) can be used to control activation or deactivation of the share line S(N−3).

A method for detecting the array substrate provided in the present embodiment will be explained in detail in the following.

During an early stage of mass production, a short circuit defect would easily occur between the charge line and the gate line that are located within each row of subarea. A first detecting mode can be used for detection. The detecting circuits G1-G6 can be grouped in the same way as in Embodiment One, and a first detecting signal successively provided to the three groups of gate lines can be completely the same as that in Embodiment One.

During the time period of T1, the first detecting signal is provided to the detecting circuits G1 and G4. At this moment, no detecting signal exists in G2 and G5, or G3 and G6.

Different from Embodiment One, under normal circumstances in Embodiment Two, the charge line C(N+2) located in the (N+2)$^{th}$ row of subarea, and the share line S(N−2) located in the (N−2)$^{th}$ row of subarea can receive the first detecting signal from the detecting circuit G1. In the same way, the charge line C(N−1) located in the (N−1)$^{th}$ row of subarea, and the share line S(N−5) located in the (N−5)$^{th}$ row of subarea can receive the first detecting signal from the detecting circuit G4. Moreover, the charge line C(N+5) located in the (N+5)$^{th}$ row of subarea, and the share line S(N+1) located in the (N+1)$^{th}$ row of subarea can receive the first detecting signal from the detecting circuit G4 also. That is, the row numbers of the subareas that can receive the first detecting signal via corresponding charge lines are N−1, N+2, and N+5, wherein a difference value between and among the row numbers can be 3 or 6.

If a short circuit defect exists at a position 408 of the array substrate, the charge line C(N+1) located in the (N+1)$^{th}$ row would also receive the first detecting signal, due to a short circuit connection between the charge line C(N+1) and the share line S(N+1). This would further enable the detecting circuit G2 to receive the first detecting signal. As such, the detecting method according to this embodiment can be used to detect a shot circuit defect possibly existing in a line bridge area outside of the (N+1)$^{th}$ row of subarea.

Similarly, during the time period of T2, the first detecting signal is provided to the detecting circuits G2 and G5. At this moment, no detecting signal exists in G1 and G4, or G3 and G6.

Different from Embodiment One, under normal circumstances in Embodiment Two, the charge line C(N+1) located in the (N+1)$^{th}$ row of subarea, and the share line S(N−3) located in the (N−3)$^{th}$ row of subarea can receive the first detecting signal from the detecting circuit G2, while the charge line C(N+4) located in the (N+4)$^{th}$ row of subarea, and the share line S(N) located in the N$^{th}$ row of subarea can receive the first detecting signal from the detecting circuit G5. That is, the row numbers of the subareas that can receive the first detecting signal via corresponding charge lines are N+4 and N+1, wherein a difference value between the row numbers is 3.

If a short circuit defect exists at a position 407 of the array substrate, the charge line C(N) located at the N$^{th}$ row would also receive the first detecting signal, due to a short circuit connection between the charge line C(N) and the share line S(N). This would further enable the detecting circuit G3 to receive the first detecting signal. As such, the detecting method according to this embodiment can be used to detect a shot circuit defect possibly existing between the charge line and the share line that are located in the N$^{th}$ row of subarea.

Similarly, during the time period of T3, the detecting signal is provided to the detecting circuits G3 and G6. At this moment, no detecting signal exists in G1 and G4, or G2 and G5.

In mass production, the second detecting mode will be used for detection. The detecting circuits G1-G6 can be grouped in exactly the same way as in Embodiment One, and the second detecting signal successively provided to the two groups of gate lines and the steps thereof are also exactly the same as those in Embodiment One, and therefore will not be repeatedly explained herein.

This embodiment is directed to an N+4 type charge sharing array substrate, wherein six detecting circuits are provided in the detecting area, and two detecting modes can be adopted. In the two detecting modes, different detecting signals are applied to the six detecting circuits, whereby different detecting effects can be obtained. Therefore, the two detecting modes can be switched therebetween according to the production conditions, thereby improving the detecting rate.

Although the present disclosure has been described with reference to preferred embodiments, various modifications and variants to the present disclosure may be made by anyone skilled in the art, without departing from the scope and spirit of the present disclosure. In particular, as long as there is no structural conflict, various embodiments as well as the respective technical features mentioned herein may be combined with one another in any manner. The present disclosure is not limited to the specific embodiments disclosed herein, but rather includes all the technical solutions falling within the scope of the claims.

The invention claimed is:

1. An array substrate, comprising:
   a display area, which includes a plurality of rows of subareas, each row of subarea being provided with a charge line and a share line, wherein the share line located in an $N^{th}$ row of subarea is connected to the charge line located in an $(N+J)^{th}$ row of subarea, N being a positive number while J being a positive even number, and
   a detecting area, which includes six detecting circuits from a first detecting circuit to a sixth detecting circuit, connected to the charge lines located in six successive rows of subareas in the display area in one-to-one correspondence,
   wherein in a first detecting mode, the first to the sixth detecting circuits are divided into three groups, and a first detecting signal is provided to the three groups of detecting circuits successively, to detect a circuit defect existing in the charge line and the share line that are located in each row of subarea, and
   wherein in a second detecting mode, the first to the sixth detecting circuits are divided into two groups, and a second detecting signal is provided to the two groups of detecting circuits successively, to detect a circuit defect existing in the charge lines and the share lines that are located in adjacent rows of subareas.

2. The array substrate according to claim 1, wherein in the first detecting mode, the three groups of detecting circuits include a group consisting of the first and the fourth detecting circuits, a group consisting of the second and the fifth detecting circuits, and a group consisting of the third and the sixth detecting circuits.

3. The array substrate according to claim 2, wherein when the first detecting signal is in effect, a difference value between and among row numbers of subareas that receive the first detecting signal via corresponding charge lines is a multiple of 3.

4. The array substrate according to claim 2, wherein J is 2 or 4.

5. The array substrate according to claim 3, wherein J is 2 or 4.

6. The array substrate according to claim 1, wherein in the second detecting mode, the two groups of detecting circuits include a group consisting of the first, the third, and the fifth detecting circuits, and a group consisting of the second, the fourth, and the sixth detecting circuits.

7. The array substrate according to claim 6, wherein J is 2 or 4.

8. A method for detecting an array substrate, comprising:
   providing a display area, which includes a plurality of rows of subareas, each row of subarea being provided with a charge line and a share line, wherein the share line located in an $N^{th}$ row of subarea is connected to the charge line located in an $(N+J)^{th}$ row of subarea, N being a positive number while J being a positive even number,
   providing a detecting area, which includes six detecting circuits from a first detecting circuit to a sixth detecting circuit, connected to the charge lines located in six successive rows of subareas in the display area in one-to-one correspondence,
   dividing, in a first detecting mode, the first to the sixth detecting circuits into three groups, and providing a first detecting signal to the three groups of detecting circuits successively, to detect a circuit defect existing in the charge line and the share line that are located in each row of subarea, and
   dividing, in a second detecting mode, the first to the sixth detecting circuits into two groups, and providing a second detecting signal to the two groups of detecting circuits successively, to detect a circuit defect existing in the charge lines and the share lines that are located in adjacent rows of subareas.

9. The method according to claim 8, wherein in the first detecting mode, the three groups of detecting circuits include a group consisting of the first and the fourth detecting circuits, a group consisting of the second and the fifth detecting circuits, and a group consisting of the third and the sixth detecting circuits.

10. The method according to claim 9, wherein when the first detecting signal is in effect, a difference value between and among row numbers of subareas that receive the first detecting signal via corresponding charge lines is a multiple of 3.

11. The method according to claim 9, wherein J is 2 or 4.

12. The method according to claim 10, wherein J is 2 or 4.

13. The method according to claim 8, wherein in the second detecting mode, the two groups of detecting circuits include a group consisting of the first, the third, and the fifth detecting circuits, and a group consisting of the second, the fourth, and the sixth detecting circuits.

14. The method according to claim 13, wherein J is 2 or 4.

* * * * *